(12) United States Patent
Callegari et al.

(10) Patent No.: US 8,772,116 B2
(45) Date of Patent: Jul. 8, 2014

(54) DIELECTRIC EQUIVALENT THICKNESS AND CAPACITANCE SCALING FOR SEMICONDUCTOR DEVICES

(71) Applicant: International Business Machines Corporation, Armonk, NY (US)

(72) Inventors: Alessandro Callegari, Yorktown Heights, NY (US); Ko-Tao Lee, White Plains, NY (US); Devendra K. Sadana, Pleasantville, NY (US); Kuen-Ting Shiu, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 25 days.

(21) Appl. No.: 13/692,603

(22) Filed: Dec. 3, 2012

(65) Prior Publication Data

US 2014/0138781 A1    May 22, 2014

Related U.S. Application Data

(63) Continuation of application No. 13/681,758, filed on Nov. 20, 2012, now abandoned.

(51) Int. Cl.
*H01L 21/336*    (2006.01)

(52) U.S. Cl.
USPC ........... 438/292; 438/275; 438/288; 438/308; 438/381

(58) Field of Classification Search
None
See application file for complete search history.

(56) References Cited

U.S. PATENT DOCUMENTS

| | | | |
|---|---|---|---|
| 7,989,902 B2 | 8/2011 | Ando et al. | |
| 2009/0108294 A1 | 4/2009 | Choi et al. | |
| 2010/0244206 A1* | 9/2010 | Bu et al. | 257/635 |
| 2011/0012210 A1 | 1/2011 | Xu | |
| 2011/0175147 A1 | 7/2011 | Adusumilli et al. | |

OTHER PUBLICATIONS

Ando, T. "Ultimate Scaling of High-K Gate Dielectrics: Higher-K or Interfacial Layer Scavenging" Materials, vol. 5, Issue: 3. Jan. 2012. Pages 478-500.

Lee, K. Y., et al. "Achieving 1NM Capacitive Effective Thickness in Atomic Layer Deposited HFO2 on IN0.53GA0.47AS" Applied Physics Letters: Dielectrics and Ferroelectricity, vol. 92, Issue 25, Mar. 2008. pp. 1-3.

Lee, W. C., et al. "Nano-Electronics of High K Dielectrics on Exotic Semiconductors for Science and Technology Beyond SI CMOS" International Symposium on VLSI Technology, Systems and Applications (VLSI-TSA). Apr. 2010. pp. 173-174.

Suzuki, R., et al. "1-NM-Capacitance-Equivalent-Thickness HFO2/AL2O3/INGAAS Metal-Oxide-Semiconductor Structure With Low Interface Trap Density and Low Gate Leakage Current Density" Applied Physics Letters. Mar. 2012. pp. 1-3.

Xie, Q., et al. "TIO2/HFO2 Bi-Layer Gate Stacks Grown by Atomic Layer Deposition for Germanium-Based Metal-Oxide-Semiconductor Devices Using Geoxny Passivation Layer" Electrochemical and Solid-State Letters, vol. 14. Mar. 2011. pp. 27-30.

* cited by examiner

*Primary Examiner* — Kyoung Lee
(74) *Attorney, Agent, or Firm* — Tutunjian & Bitetto, P.C.; Louis J. Percello, Esq.

(57) ABSTRACT

A device and method for fabricating a capacitive component includes forming a high dielectric constant material over a semiconductor substrate and forming a scavenging layer on the high dielectric constant material. An anneal process forms oxide layer between the high dielectric constant layer and the scavenging layer such that oxygen in the high dielectric constant material is drawn out to reduce oxygen content.

47 Claims, 5 Drawing Sheets

FIG. 6

DIELECTRIC EQUIVALENT THICKNESS AND CAPACITANCE SCALING FOR SEMICONDUCTOR DEVICES

RELATED APPLICATION INFORMATION

This application is a Continuation application of co-pending U.S. patent application Ser. No. 13/681,758 filed on Nov. 20, 2012, incorporated herein by reference in its entirety.

BACKGROUND

1. Technical Field

The present invention relates to semiconductor devices and fabrication, and more particularly to a capacitive stack of layers where material selection and function increases capacitance equivalent thickness.

2. Description of the Related Art

Non-silicon high mobility substrates (e.g., III-V, II-VI materials) may provide a possible alternative to metal oxide semiconductor (MOS) Si devices beyond the 15 nm node. Surface channel devices are a viable alternative from both an integration and implementation point of view in large scale integration (LSI) and very large scale integration (VLSI). Surface channel devices require a high performance thin inversion layer or capacitance equivalent thickness (CET) of 1-1.5 nm. Currently, III-V MOS devices have CET of 25 A (2.5 nm) or higher.

SUMMARY

A method for fabricating a capacitive component includes forming a high dielectric constant material over a semiconductor material; forming a scavenging layer on the high dielectric constant material; and annealing to form an oxide layer between the high dielectric constant layer and the scavenging layer such that oxygen in the high dielectric constant material is drawn out to reduce oxygen content.

Another method for fabricating a capacitive component includes providing a first capacitive plate formed in a semiconductor substrate; forming a capacitor dielectric on the substrate with a high dielectric constant material; forming a scavenging layer on the capacitor dielectric; annealing to form an oxide layer between the capacitor dielectric and the scavenging layer such that oxygen in the capacitor dielectric is drawn out to reduce oxygen content in the capacitor dielectric; removing the scavenging layer and the oxide layer; and forming a second electrode on the capacitor dielectric.

Yet another method for fabricating a capacitive component includes providing a channel layer in a semiconductor substrate; forming a gate dielectric over the substrate, which includes a high dielectric constant material; forming a scavenging layer on the gate dielectric; annealing to form an oxide layer between the gate dielectric and the scavenging layer such that oxygen in the gate dielectric is drawn out to reduce oxygen content in the gate dielectric; removing the scavenging layer and the oxide layer; and forming a gate electrode on the gate dielectric.

A device includes semiconductor material, and a capacitor dielectric formed over the semiconductor material. The capacitor dielectric includes an oxygen scavenged high dielectric constant material formed over the semiconductor material wherein the high dielectric constant material includes reduced oxygen content sufficient to permit an improved capacitive equivalent thickness (CET) of at least 5 Angstroms for the high dielectric constant material.

Another device includes a gate structure including a gate dielectric having an oxygen scavenged high dielectric constant material formed over a semiconductor substrate wherein the high dielectric constant material includes reduced oxygen content sufficient to permit an improved capacitive equivalent thickness (CET) of at least 5 Angstroms for the high dielectric constant material. A gate conductor is configured to enable a channel formed in the semiconductor substrate adjacent to the gate structure.

Yet another device includes a substrate including one of a III-V material or a II-VI material and a dielectric stack formed over the substrate with improved capacitive equivalent thickness (CET) and equivalent oxide thickness (EOT). The stack has an oxygen scavenged passivation layer formed on the substrate and an oxygen scavenged high dielectric constant material formed over the passivation layer wherein the passivation layer and the high dielectric constant layer include reduced oxygen content sufficient to permit an improvement of at least 5 Angstroms for CET and EOT. A conductive material is formed on the high dielectric constant material.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, a semiconductor stack is provided which enhances capacitive effective thickness (CET) and equivalent oxide thickness (EOT) of the stack. The stack is particularly useful for forming a capacitor or gate structure for a metal oxide semiconductor (MOS) device and specifically for 45 nm node devices and beyond, e.g., 15 nm node devices. Other structures and components are also contemplated, e.g., capacitors, diodes, etc.

CET is a comparison to the capacitance to a layer of silicon dioxide, i.e., a thickness required for achieving a specified capacitive coupling with silicon dioxide. For example, if a layer has a thickness of 5 nm but has the capacitive properties of 1 nm of silicon dioxide, the CET is 1 nm for the 5 nm layer. Likewise, the concept equivalent oxide thickness (EOT) is similar to CET, except that EOT does not consider the contribution of the capacitance from the semiconductor substrate.

The present principles provide a way to scale CET by using a layer with high oxygen affinity as a scavenger layer to reduce oxygen and reduce CET by at least another 0.5 nm. In a particularly useful embodiment, the layer with high oxygen affinity may include a metal, such as aluminum, although other metals or materials may be employed. After formation of the high oxygen affinity layer, an anneal is performed to move oxygen toward the high oxygen affinity layer. In one embodiment, the high oxygen affinity layer may be removed and a permanent layer formed in its place. This process provides for a significant reduction in CET.

It is to be understood that the present invention will be described in terms of a given illustrative architecture having a substrate or wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present principles may be directed toward integrated circuit chips. A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., GaInP, InGaAs, SiGe, etc. These compounds may include different proportions of the elements within the compound, e.g., InGaAs includes $In_xGa_yAs_{1-x-y}$, where x, y are less than or equal to 1, or SiGe includes $Si_xGe_{1-x}$ where x is less than or equal to 1, etc. In addition, other elements may be included in the compound, such as, e.g., AlInGaAs, and still function in accordance with the present principles. The compounds with additional elements will be referred to herein as alloys.

Figure 1:
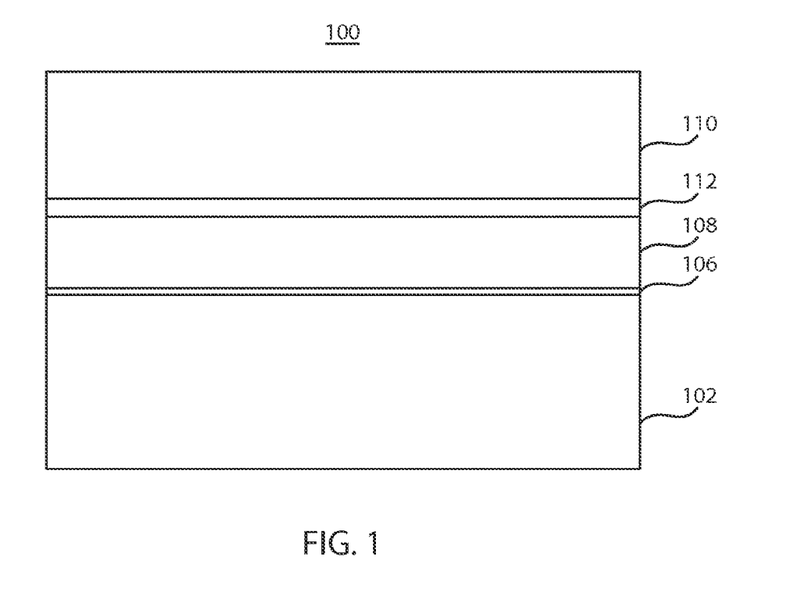
FIG. 1 is a cross-sectional view of a capacitive device with a scavenging layer formed thereon in accordance with the present principles.

Referring now to the drawings in which like numerals represent the same or similar elements and initially to FIG. 1, a MOS capacitor 100 is illustratively shown in accordance with one embodiment. The capacitor 100 is fabricated on a substrate 102, which may include silicon, II-VI materials or III-V materials. In one illustrative embodiment, substrate 102 may include bulk material with one or more epitaxial layers (e.g., III-V material such as InGaAs) grown on semiconductor substrate 102. The epitaxial layers may include other materials as well, e.g., Si, GaAs, InP, etc.

On top of the substrate 102, a thin passivation or passivation layer 106 may be formed. The passivating layer 106 may include Si having a thickness of about 1.1 nm. Layer 106 may be formed by, e.g., ultra high vacuum chemical vapor deposition (UHVCVD), plasma enhanced chemical vapor deposition (PECVD), or molecular beam epitaxy (MBE).

A high dielectric constant (high-k or HK) dielectric layer 108 is formed on the passivating layer 106. The high-k layer 108 may include a thickness of about 10-70 Angstroms, preferably around 40 Angstroms. In an illustrative example, the high-k layer 108 includes a Hafnium oxide (e.g., $HfO_2$) although other high k dielectrics may be employed. Layer 108 may be formed by, e.g., atomic layer deposition (ALD), PECVD, or MBE.

An oxygen absorbing or scavenging layer 110 is formed on the high-k layer 108. The oxygen absorbing layer 110 may include a material with high oxygen affinity. The layer 110 may include a metal, such as, aluminum, hafnium, manganese, titanium, tantalum, etc. or combinations of these materials, e.g., TiAl, TaAl, TiN, TaN and oxynitrides of these compounds). The layer 110 may also include a conductive, heavily doped semiconductor with high oxygen affinity, e.g., Si, SiGe, etc. Layer 110 may be formed by CVD, sputtering, thermal evaporation, e-beam evaporation, etc.

In one embodiment, the high-k layer 108 is annealed before the formation of the oxygen absorbing layer 110. For example, the anneal may include, e.g., a $N_2$ anneal at about 750 degrees C. for 5 seconds. Other anneal processes are also contemplated. For example, the annealing of the different layers can be performed using a rapid thermal anneal (RTA), a furnace anneal equipped with $N_2$, or other gas, etc.

As a result of the oxygen affinity of layer 110, an oxide will begin to form between layer 110 and the high-k layer 108. For example, when aluminum is employed for layer 110, an oxide layer 112, e.g., $Al_2O_3$, begins to form between layer 110 and layer 108. The formation of the oxide layer may be increased by applying an anneal process. The anneal process may include a 300 degrees C. to 750 degrees C. anneal for 5 seconds to about 60 seconds.

Figure 2:
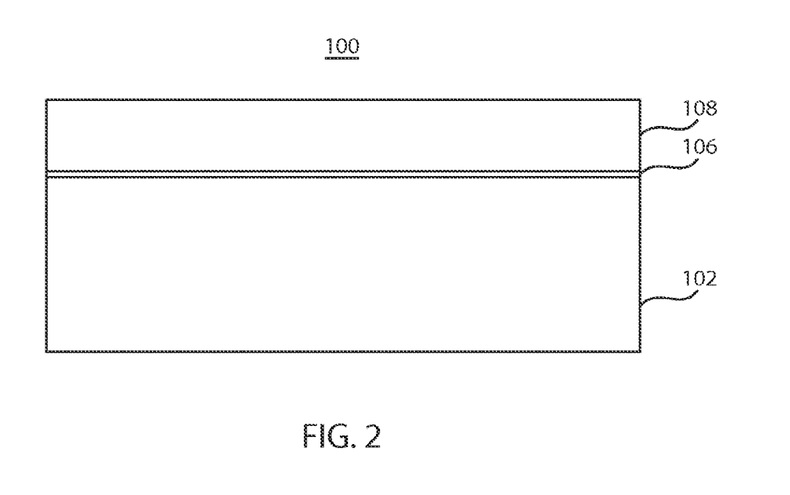
FIG. 2 is a cross-sectional view of the capacitive device with the scavenging layer and oxide layer removed in accordance with one embodiment.

Referring to FIG. 2, after the anneal process, the layers 110 and 112 may be removed. Layer 110 is formed as a scavenger layer designed to absorb and remove oxygen from the dielectric layer(s) in the stack 100. The removal of layer 110 and 112 may include performing a wet etch or dry etch to selectively remove these layers relative to the underlying high-k dielectric layer 108, depending on the materials of the layers 110 and 112. The high-k dielectric layer 108 may again be annealed at 750 degrees C. for 5 seconds.

Note that layers 110 and 112 may remain in the structure 100 as depicted in FIG. 1, as it is not necessary to remove layers 110 and 112 in all embodiments. For example in FIG. 1, a capacitor may be formed where the substrate 102 acts as one electrode and the layer 110 acts as another electrode with high-k dielectric layer 108 being included in the capacitor dielectric.

Figure 3:
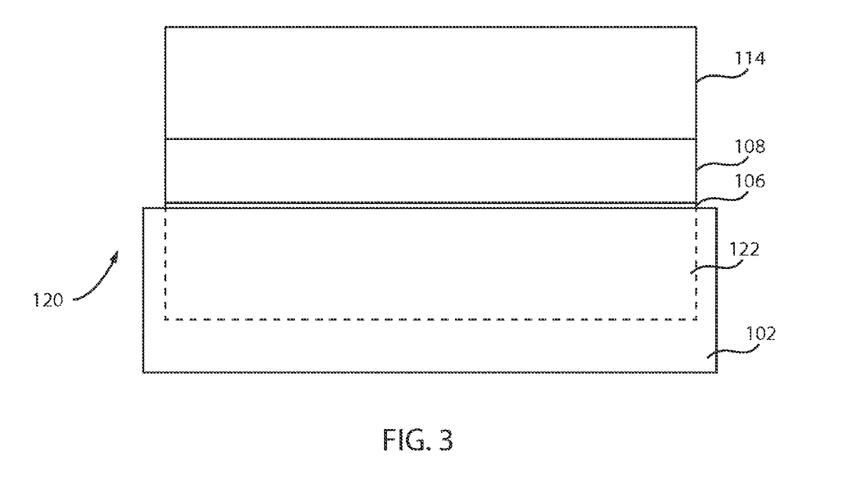
FIG. 3 is a cross-sectional view of a capacitor formed in accordance with the present principles.

Referring to FIG. 3, in the case of removing layers 110 and 112, another conductive film 114 may be deposited on the high-k dielectric layer 108 to form a capacitor structure 120. On the other hand, if layers 110 and 112 are not removed, the conductive layer 114 may be optionally deposited on the top of layer 110. It should be understood that the capacitor structure 120 may include a doped substrate 102, which functions as a first electrode 122, the conductive film 114 functions as a second electrode and the materials between these electrodes function as a capacitor dielectric. While the present principles are illustratively described in terms of a single scavenger layer, it should be understood that the process may be repeated one or more times to further reduce oxide levels in the capacitor dielectric materials. As the result of the use of a single scavenger layer, the capacitance effective thickness (CET) is reduced by 5 Angstroms or more.

In one example, surface channel devices needing a high performance thin inversion layer or capacitance equivalent thickness (CET) of 1-1.5 nm, can be achieved in accordance with the present principles using II-VI or III-V materials. These materials include a CET of between 2-2.5 nm. By reducing the CET by at least 5-10 Angstroms, these materials can be employed in surface channel devices and other structures. II-VI materials may include ZnO, ZnTe, CdS, CdSe, etc. III-V materials may include GaAs, InP, InGaAs, etc.

Figure 4:
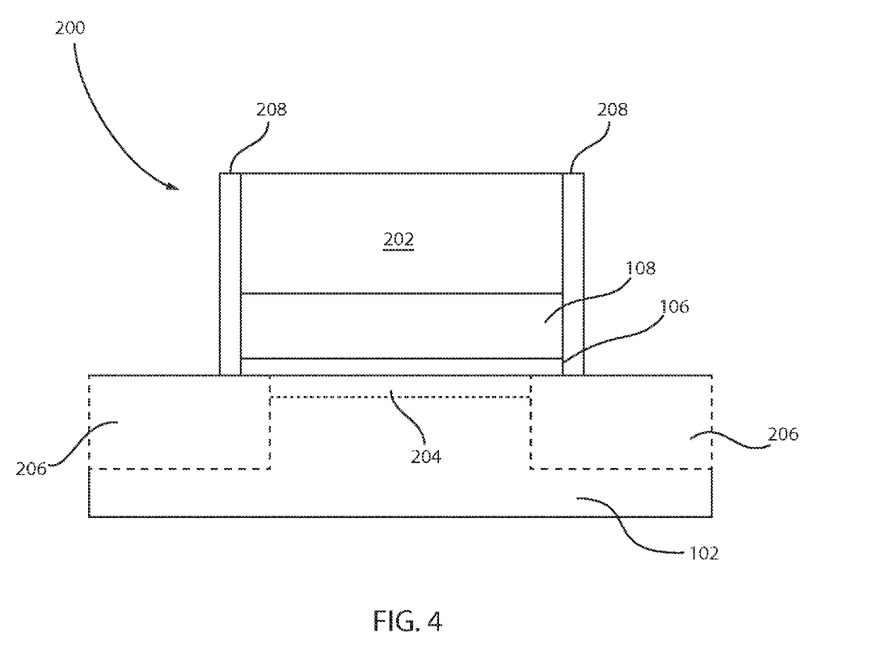
FIG. 4 is a cross-sectional view of a gate structure formed in accordance with the present principles.

Referring to FIG. 4, a gate stack 200 is illustratively shown in accordance with another embodiment. The gate stack 200 may include the same materials as described above for stack 100. Gate stack 200 includes high-k layer 108 and a metal gate (MG) 202 instead of an electrode layer 114 (or layer 110). It should be understood that MG 202 may be formed from or include layer 110 and layer 112, if these layers were not removed. Gate stack 200 is formed over a channel 204 between diffusion regions 206 (e.g., source and drain regions). Dielectric spacers 208 are formed on sidewalls of the gate stack 200.

As a result of improved CET and EOT the gate structure 200 has excellent leakage performance from high-k materials having a same physical thickness but improved equivalent oxide thickness (EOT) due to the removal of oxygen. The CET is often represented as $T_{inv}$, which is the inversion oxide thickness of a gate dielectric, which includes layers 106 and 108. In technologies having a very small minimum feature size, e.g., such as about 45 nm or less, a 5 Angstroms difference in $T_{inv}$ may significantly improve the short channel effects of the device.

Figure 5:
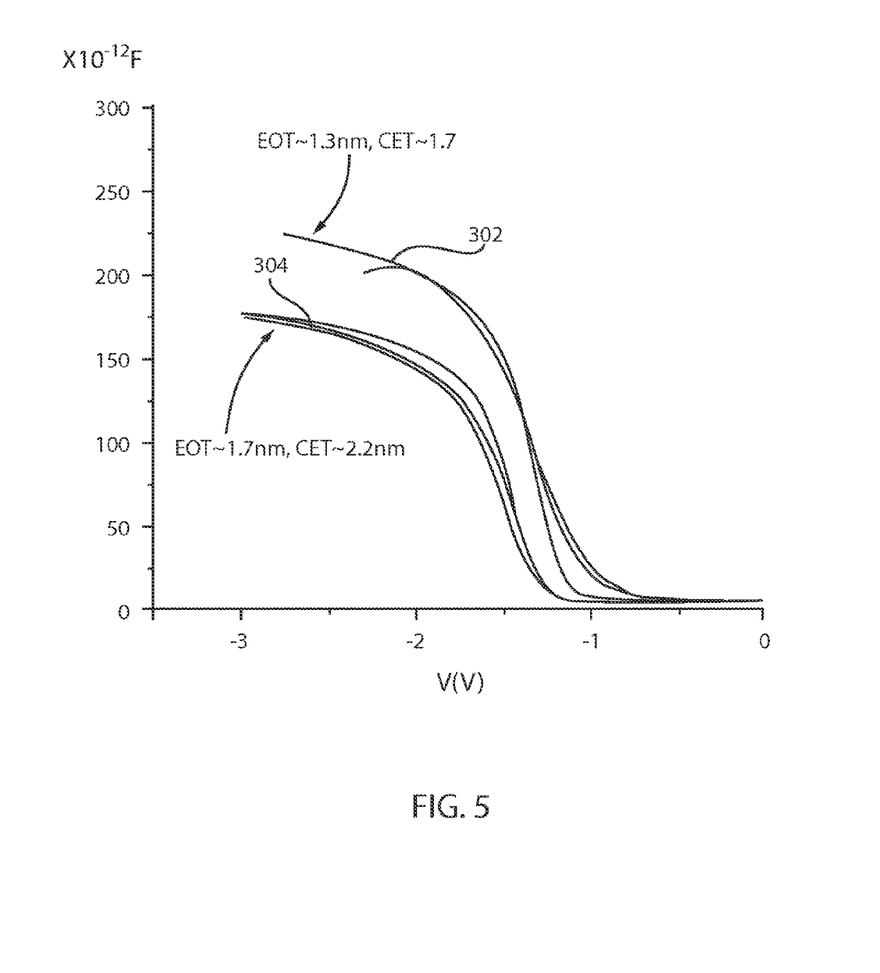
FIG. 5 are plots of capacitance ($\times 10^{-12}$ Farad) versus capacitive voltage (volts) showing a comparison of capacitive equivalent thickness (CET) and equivalent oxide thickness (EOT) for a device formed using a scavenging layer and a device formed without a scavenging layer in accordance with the present principles.

Referring to FIG. 5, plots showing EOT and CET against capacitive voltage (V) for two devices are depicted for comparison. Plot 302 shows a device having an aluminum blank metal deposited as a scavenger layer followed by a 400 degrees C. anneal and depicted in accordance with the present principles. Plot 304 shows a device formed without a scavenger layer for comparison. In accordance with the present principles, in this exemplary case, CET and EOT are improved by about 5 A. Plot 302 shows a position between −2 and −3 volts where EOT is about 1.3 nm and CET is about 1.7 nm. For a corresponding voltage in plot 304, the EOT is about 1.7 nm and CET is about 2.2 nm. The reduction in CET may be attributed to removal of interlevel oxides during annealing of the stack containing the Al blank film. By decreasing $HfO_2$ thickness to ~25 Angstroms and subtracting $Al_2O_3$ contribution, a CET of about 11 Angstroms should be obtainable using a scavenging layer in accordance with the present principles.

The plot 302 corresponds to a semiconductor structure using a III-V or II-VI material substrate with reduced CET by using a metal layer, which scavenges oxides after a moderate to high-temperature anneal. The scavenging material includes Al in this case but is not limited to Al, and may consist of Hf and its compounds, Al and its aluminate compounds (TiAl, TaAl and its oxy-nitrides), Si, SiGe, etc. The capacitive area for the measurements was about $1.13 \times 10^{-4}$ $cm^2$, and the operating frequency for the measurement was about 100 kHz.

Figure 6:
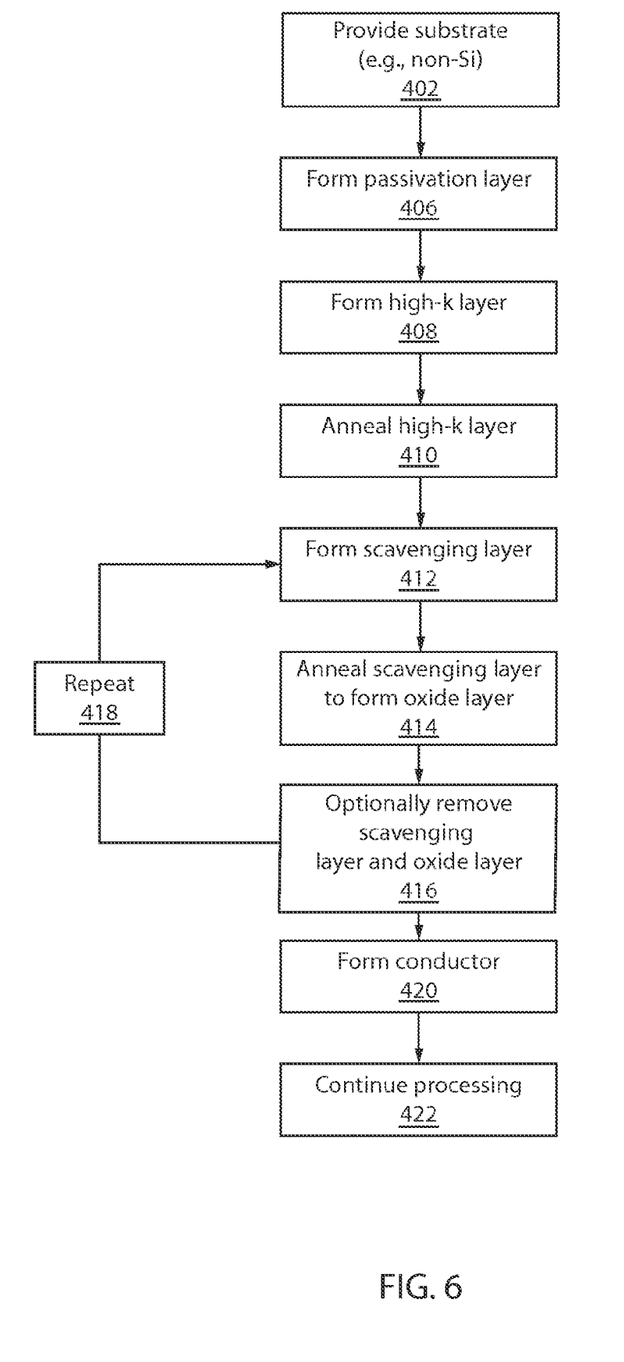
FIG. 6 is a block/flow diagram showing a method for fabricating capacitive components in accordance with illustrative embodiments.

Referring to FIG. 6, methods for fabricating a capacitive component in accordance with the present principles are illustratively depicted. In block 402, a substrate is provided. The substrate preferably includes a semiconductor substrate, e.g., silicon, III-V material or II-VI material. The substrate may be processed to form diffusion regions, etc. prior to forming the dielectric stack as will be described. In block 406, a passivation layer may be formed on the substrate. In block 408, a high dielectric constant material is formed over the passivation layer, if employed. The high-k dielectric material may include hafnium, although other materials may be employed. In block 410, an anneal process may be performed after the high dielectric constant layer has been formed and before forming a scavenging layer. In block 412, the scavenging layer is formed on the high dielectric constant material. The scavenging layer may include at least one of aluminum, titanium, silicon, etc. and alloys thereof.

In block 414, an anneal process is performed. The anneal process may be included in the formation process of the scavenging layer, although a separate process is preferred. The anneal process assists in forming an oxide layer between the high dielectric constant layer and the scavenging layer such that oxygen in the high dielectric constant material and interfaces between layers are drawn out to reduce oxygen content. Reducing the oxygen content in interfaces through the high-k layer improves the dielectric properties of the stack. In block 416, the scavenging layer and the oxide layer may be optionally removed.

In block 418, the formation and removal of the scavenging layer may be repeated to further reduce oxygen content. In block 420, a conductive film (or other film) is formed on the high dielectric constant material or on the scavenging layer, if maintained. The conductive film may be a second electrode for a capacitor or a gate metal for a gate structure, etc. It should be noted that the scavenging layer may also be employed to be a second electrode for a capacitor or a gate metal for a gate structure, etc. In block 422, processing continues as needed to complete the device.

Having described preferred embodiments for dielectric equivalent thickness and capacitance scaling for semiconductor devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A device, comprising:
semiconductor material; and
a capacitor dielectric formed over the semiconductor material and having:
an oxygen scavenged high dielectric constant material formed over the semiconductor material wherein the high dielectric constant material includes reduced oxygen content sufficient to permit an improved capacitive equivalent thickness (CET) of at least 5 Angstroms for the high dielectric constant material.

2. The device as recited in claim 1, further comprising:
a first electrode formed on the high dielectric constant material; and
a second electrode formed in the semiconductor material.

3. The device as recited in claim 2, wherein the second electrode includes a diffusion layer in the semiconductor material.

4. The device as recited in claim 2, wherein the first electrode includes a metal.

5. The device as recited in claim 1, wherein the semiconductor material includes one of silicon, a III-V material or a II-VI material.

6. The device as recited in claim 1, wherein the high dielectric constant material includes hafnium.

7. The device as recited in claim 1, further comprising a passivation layer formed between the semiconductor material and the high dielectric constant material.

8. The device as recited in claim 1, further comprising a scavenging layer formed on the high dielectric constant material, the scavenging layer being configured to draw out oxygen from the high dielectric constant material.

9. The device as recited in claim 8, wherein the scavenging layer includes at least one of aluminum, titanium, silicon and alloys thereof.

10. A device, comprising:
a gate structure including:
a gate dielectric having:
an oxygen scavenged high dielectric constant material formed over a semiconductor substrate wherein the high dielectric constant material includes reduced oxygen content sufficient to permit an improved capacitive equivalent thickness (CET) of at least 5 Angstroms for the high dielectric constant material; and
a gate conductor configured to enable a channel formed in the semiconductor substrate adjacent to the gate structure.

11. The device as recited in claim 10, wherein the semiconductor substrate includes one of silicon, a III-V material or a II-VI material.

12. The device as recited in claim 10, wherein the gate conductor includes a metal gate.

13. The device as recited in claim 10, wherein the high dielectric constant material includes hafnium.

14. The device as recited in claim 10, further comprising a passivation layer formed between the semiconductor substrate and the high dielectric constant material.

15. The device as recited in claim 10, wherein the gate conductor includes a scavenging layer formed on the high dielectric constant material, the scavenging layer being configured to draw out oxygen from the high dielectric constant material.

16. The device as recited in claim 15, wherein the scavenging layer includes at least one of aluminum, titanium, silicon and alloys thereof.

17. A device, comprising:
a substrate including one of a III-V material or a II-VI material;
a dielectric stack formed over the substrate with improved capacitive equivalent thickness (CET) and equivalent oxide thickness (EOT), having:
an oxygen scavenged passivation layer formed on the substrate; and
an oxygen scavenged high dielectric constant material formed over the passivation layer wherein the passivation layer and the high dielectric constant layer include reduced oxygen content sufficient to permit an improvement of at least 5 Angstroms for CET and EOT; and
a conductive material formed on the high dielectric constant material.

18. The device as recited in claim 17, wherein the device includes a capacitor and the conductive material forms an electrode of the capacitor, which includes a scavenging layer formed on the high dielectric constant material, the scavenging layer being configured to draw out oxygen from the high dielectric constant material.

19. The device as recited in claim 18, wherein the scavenging layer includes at least one of aluminum, titanium, silicon and alloys thereof.

20. The device as recited in claim 17, wherein the high dielectric constant material includes hafnium.

21. The device as recited in claim 17, wherein the passivation layer includes silicon.

22. The device as recited in claim 17, wherein the conductive material forms a gate conductor, which includes a scavenging layer formed on the high dielectric constant material, the scavenging layer being configured to draw out oxygen from the high dielectric constant material.

23. The device as recited in claim 22, wherein the scavenging layer includes at least one of aluminum, titanium, silicon and alloys thereof.

24. A method for fabricating a capacitive component, comprising:
forming a high dielectric constant material over a semiconductor material;
forming a scavenging layer on the high dielectric constant material; and
annealing to form an oxide layer between the high dielectric constant layer and the scavenging layer such that oxygen in the high dielectric constant material is drawn out to reduce oxygen content.

25. The method as recited in claim 24, wherein the semiconductor material includes one of silicon, a III-V material or a II-VI material.

26. The method as recited in claim 24, wherein forming the high dielectric constant material includes forming the high dielectric constant material using Hafnium.

27. The method as recited in claim 24, further comprising annealing the high dielectric constant layer before forming the scavenging layer.

28. The method as recited in claim 24, further comprising forming a passivation layer on the semiconductor material.

29. The method as recited in claim 24, removing the scavenging layer and the oxide layer.

30. The method as recited in claim 29, further comprising repeating the formation and removal of the scavenging layer to further reduce oxygen content.

31. The method as recited in claim 29, wherein a conductive material is formed over the high dielectric constant material.

32. The method as recited in claim 24, wherein use of the scavenging layer and the oxide layer increases a capacitive equivalent thickness (CET) by at least 5 Angstroms.

33. The method as recited in claim 24, wherein the scavenging layer includes at least one of aluminum, titanium, silicon and alloys thereof.

34. The method as recited in claim 24, wherein the capacitive component includes one of a capacitor and a gate structure.

35. A method for fabricating a capacitive component, comprising:
providing a first capacitive plate formed in a semiconductor substrate;
forming a capacitor dielectric on the substrate with a high dielectric constant material;
forming a scavenging layer on the capacitor dielectric;
annealing to form an oxide layer between the capacitor dielectric and the scavenging layer such that oxygen in the capacitor dielectric is drawn out to reduce oxygen content in the capacitor dielectric;
removing the scavenging layer and the oxide layer; and
forming a second electrode on the capacitor dielectric.

36. The method as recited in claim 35, wherein the semiconductor substrate includes one of silicon, a III-V material or a II-VI material.

37. The method as recited in claim 35, further comprising annealing the high dielectric constant layer before forming the scavenging layer.

38. The method as recited in claim 35, wherein the first capacitive plate includes a diffusion region.

39. The method as recited in claim 35, further comprising forming a passivation layer on the substrate.

40. The method as recited in claim 35, further comprising repeating the formation and removal of the scavenging layer to further reduce oxygen content.

41. The method as recited in claim 35, wherein removing the scavenging layer and the oxide layer increases a capacitive equivalent thickness (CET) by at least 5 Angstroms.

42. The method as recited in claim 35, wherein the scavenging layer includes at least one of aluminum, titanium, silicon and alloys thereof.

43. A method for fabricating a capacitive component, comprising:
providing a channel layer in a semiconductor substrate;
forming a gate dielectric over the substrate, which includes a high dielectric constant material;
forming a scavenging layer on the gate dielectric;
annealing to form an oxide layer between the gate dielectric and the scavenging layer such that oxygen in the gate dielectric is drawn out to reduce oxygen content in the gate dielectric;
removing the scavenging layer and the oxide layer; and
forming a gate electrode on the gate dielectric.

44. The method as recited in claim 43, wherein the semiconductor substrate includes one of silicon, a III-V material or a II-VI material.

45. The method as recited in claim 43, wherein the scavenging layer includes at least one of aluminum, titanium, silicon and alloys thereof.

46. The method as recited in claim 43, further comprising repeating the formation and removal of the scavenging layer to further reduce oxygen content.

47. The method as recited in claim 43, wherein removing the scavenging layer and the oxide layer increases a capacitive equivalent thickness (CET) by at least 5 Angstroms.

* * * * *